(12) United States Patent
Schoen et al.

(10) Patent No.: US 9,333,707 B2
(45) Date of Patent: May 10, 2016

(54) JOINING METHOD AND JOINT FOR MICROFLUIDIC COMPONENTS

(75) Inventors: Christian Schoen, Dresden (DE);
Thorsten Joedicke, Toenisvorst (DE);
Dirk Kurowski, Gevelsberg (DE)

(73) Assignee: Boehringer Ingelheim Microparts GmbH, Dortmund (DE)

( * ) Notice: Subject to any disclaimer, the term of this patent is extended or adjusted under 35 U.S.C. 154(b) by 477 days.

(21) Appl. No.: 13/500,139

(22) PCT Filed: Oct. 5, 2010

(86) PCT No.: PCT/EP2010/064808
§ 371 (c)(1),
(2), (4) Date: Jun. 11, 2012

(87) PCT Pub. No.: WO2011/042422
PCT Pub. Date: Apr. 14, 2011

(65) Prior Publication Data
US 2012/0275972 A1    Nov. 1, 2012

(30) Foreign Application Priority Data
Oct. 5, 2009    (EP) ..................................... 09012564

(51) Int. Cl.
*B01L 99/00*    (2010.01)
*B29C 65/60*    (2006.01)
(Continued)

(52) U.S. Cl.
CPC ......... *B29C 65/606* (2013.01); *B01L 3/502707* (2013.01); *B29C 66/542* (2013.01); *B29C 66/5412* (2013.01); *B29C 66/81422* (2013.01);
(Continued)

(58) Field of Classification Search
USPC ......................................................... 422/503
See application file for complete search history.

(56) References Cited

U.S. PATENT DOCUMENTS 5,580,202 A * 12/1996 Luhm ........................... 411/507
6,171,038 B1 * 1/2001 Pratt et al. ...................... 411/43
(Continued)

FOREIGN PATENT DOCUMENTS

EP    1712342 A1    10/2006
JP    62067728        4/1987
(Continued)

OTHER PUBLICATIONS

International Search Report for corresponding PCT/EP2010/064808; date of mailing: Feb. 4, 2011.
(Continued)

*Primary Examiner* — Paul Hyun
(74) *Attorney, Agent, or Firm* — Michael P. Morris; Mary-Ellen M. Devlin

(57) ABSTRACT

A cartridge includes a fluidically conductive floor element, a cover, and a film disposed between the elements. The cover or the floor element and the film include a filling opening for filling microfluidic channels in one of the elements having sample fluid. Pins engage in corresponding holes in the film and the associated element. By way of deforming a pin, a friction fit is produced with the wall of a hole, and a head contacting the associated substrate in a form-fitting manner is formed. A press tool is placed on a head end of a pin at a predetermined pressure, and heat transfer into the pin takes place during a weld time. The pin material is brought to above the glass transition temperature and/or the melting point, and a friction fit between the pin and the wall of the hole is formed by flowing the pin material in the hole.

17 Claims, 8 Drawing Sheets

(51) Int. Cl.
  B01L 3/00 (2006.01)
  B29C 65/00 (2006.01)
  B81C 3/00 (2006.01)
  B29C 65/08 (2006.01)
  B29C 65/82 (2006.01)
  B29K 23/00 (2006.01)
  B29K 25/00 (2006.01)
  B29K 33/00 (2006.01)
  B29K 69/00 (2006.01)
  B29K 71/00 (2006.01)
  B29L 31/00 (2006.01)

(52) U.S. Cl.
  CPC ....... B29C 66/8322 (2013.01); B29C 66/91411 (2013.01); B29C 66/91921 (2013.01); B29C 66/91943 (2013.01); B29C 66/929 (2013.01); B29C 66/949 (2013.01); B81C 3/001 (2013.01); B01L 2200/025 (2013.01); B01L 2200/0689 (2013.01); B01L 2300/0816 (2013.01); B01L 2300/0887 (2013.01); B29C 65/08 (2013.01); B29C 65/8207 (2013.01); B29C 65/8215 (2013.01); B29C 66/81417 (2013.01); B29C 66/919 (2013.01); B29C 66/91421 (2013.01); B29C 66/91933 (2013.01); B29K 2023/06 (2013.01); B29K 2023/12 (2013.01); B29K 2025/00 (2013.01); B29K 2033/12 (2013.01); B29K 2069/00 (2013.01); B29K 2071/00 (2013.01); B29L 2031/756 (2013.01); B81B 2201/058 (2013.01); B81C 2203/032 (2013.01); B81C 2203/051 (2013.01)

(56) References Cited

U.S. PATENT DOCUMENTS

| | | | |
|---|---|---|---|
| 7,595,871 B2* | 9/2009 | Weber | 356/246 |
| 2002/0079219 A1* | 6/2002 | Zhao et al. | 204/451 |
| 2005/0230767 A1 | 10/2005 | Park et al. | |
| 2005/0272142 A1 | 12/2005 | Hotta | |
| 2006/0215155 A1 | 9/2006 | Weber | |

FOREIGN PATENT DOCUMENTS

| | | |
|---|---|---|
| JP | 2002067159 A | 3/2002 |
| JP | 2006030160 A | 2/2006 |
| WO | 9526796 A1 | 10/1995 |
| WO | 0109598 A1 | 2/2001 |
| WO | 2005016529 A1 | 2/2005 |

OTHER PUBLICATIONS

Office Action for corresponding JP Application No. 2015-532567, dated Nov. 12, 2014.

* cited by examiner

JOINING METHOD AND JOINT FOR MICROFLUIDIC COMPONENTS

This application is a national stage application of PCT/EP2010/064808, filed Oct. 5, 2010.

The present invention relates to joining techniques for connecting microfludic components, particularly made of plastics, to form a microfluidic cartridge.

These microfluidic cartridges are used, for example, in point-of-care hand-held analysis devices or medical diagnostic devices in laboratories or hospitals. The field of the invention encompasses, in particular, joining techniques for producing lateral flow cartridges in which the components that are to be joined have length and width dimensions ranging from a few millimeters to several centimeters.

The field of the invention thus relates to a microfluidic cartridge according to one or more of the disclosed and/or described embodiments.

Microfluidic cartridges are frequently used in the form of single-use tests. For this purpose, a liquid for analysis which is to be tested (e.g. blood, urine or saliva) is supplied to a cartridge provided with a biosensor. The addition of the sample to the cartridge is carried out before or after the cartridge is placed in the analysis device. The analyte is added through an opening in the cartridge, the liquid then being supplied through microchannels to corresponding sample preparation chambers and sample investigation chambers.

The use of the term micro means that, at least in one geometric direction of expansion, the channels and/or chambers have a dimension on the micron scale, i.e. the measurements in at least one dimension are less than 1 mm.

By the term microfluidic cartridge is meant a device made up of several components for the distribution of liquids, which has microchannels and microcomponents of this kind.

By the term microfluidic is meant that a pressure-induced and/or capillary flow of liquid takes place through and in the microchannels and/or microchambers.

The cartridge typically consists of a plurality of plate-shaped substrates made of plastics, in particular, which are joined to one another, i.e. components which have a thickness measurement that is several times less than their length and width dimensions.

To produce the fluidic components, indentations and/or perforations are formed in a predominantly flat plate-shaped substrate and are covered with another plate-shaped substrate.

The plate-shaped substrate may be a film.

Reagents may be applied to the plate-shaped substrate or in the microchambers/microchannels.

The plate-shaped substrate may act as a carrier for a biosensor and may comprise in particular electrical components such as printed-on conductor tracks or optical components such as optical surfaces, reflective surfaces and optical waveguides.

Moreover, moulded-on shapes for the joining, guiding or handling of the component and/or the cartridge may be provided on one of the plate-shaped substrates.

Typically, the plate-shaped substrates may be at least partly covered by a film which is adhesively attached or laminated on and which tightly seals off the microfluidic channels formed therein.

As joining techniques for microfluidic components of the type described, ultrasound welding, thermal bonding or diffusion bonding, laser welding and adhesive bonding of the components, e.g. using adhesive layers, or lamination are generally known.

Another suitable connecting technique is the use of double-sided adhesive films. The hydrophobic properties of these adhesive substances, which may prevent wetting of flow channels, may be a disadvantage in the use of adhesive processes or adhesive films. When liquid adhesives are used there is the risk of blockage of fluid-conveying structures by adhesive flowing into them.

In many cases ultrasound welding techniques have the disadvantage of substantial vibratory stresses in the joining process.

These may lead to damage and subsequent malfunction of the biosensor, for example when reagents or particles have dried out in chambers or on surfaces and are detached by the vibrations during ultrasound welding, thereby interfering with the progress of the reaction in the biosensor.

In some detection reactions, particularly immunochemical assays for detecting blood components, it is necessary to filter the liquid.

During this blood separation the filtering of the blood plasma is carried out by a filter membrane which is glued, welded or clamped in a cartridge component. The clamping of the membrane may be carried out for example using flexible seals or a spring-mounted ring.

This membrane may be damaged, particularly torn, by the mechanical vibrations during ultrasound welding.

A further disadvantage is that some plastics have poor adhesive properties and welding characteristics, which occur particularly when different plastic materials are to be welded or adhesively bonded.

A disadvantage of the use of adhesive films is also the additional material costs and the work involved in processing the adhesive film (e.g. stamping or cutting out openings and channels), which incurs further costs.

Against this background there is the problem of providing a joining process and a join connection for a device of this kind which eliminates the disadvantages mentioned above.

In particular, the problem is to provide a joining process and a joint which ensures an inexpensive, strong and material-saving connection between the components of a microfluidic cartridge.

There is also the problem of providing a process and a joint which avoid mechanical loading of the components during the joining process, and allow reliable attachment of the components.

There is also the problem of providing a method and a connection for joining which does not affect the fluidic properties of the cartridge.

These problems are solved by a device according to one or more of the disclosed and/or described embodiments.

The invention relates in particular to fluidic test devices, cartridges, in which a plate-shaped fluid-conveying component is covered with a film.

The film covers channel and/or chamber structures formed in one or both sides of the plate, thus forming a microfluidic channel system with structural widths and structural heights ranging from about 10 microns to a few millimeters. The film covers the plate-shaped component partially or over its entire surface.

Preferably the material of the plate and the material of the film essentially consist of an amorphous or partially crystalline plastic selected from among polystyrene (PS), polymethyl methacrylate (PMMA), polycarbonate (PC), olefin polymers and olefin copolymers such as cycloolefin polymer and cycloolefin copolymer (COC and COP), polyamide (PA), polypropylene (PP), polyethylene (PE) or polyethyl ether ketone (PEEK).

The film may be of multi-layered construction. In particular, the film may be provided on one or both sides with an adhesive layer for attachment to the plate-shaped substrate. The adhesive layer is preferably a low-melting laminated layer or sealing layer of ethylene-vinyl acetate copolymer (EVA).

The surface and/or the channel structures may have been subjected to surface treatment and/or surface coating over all or part of their surfaces. Plasma irradiation/plasma etching, for example, may be carried out as the surface treatment/surface activation to improve the surface adhesion.

Hydrophilisation of the channel regions for improved conveying of aqueous fluids is possible, for example, as a surface coating.

Alternatively, the film may also comprise an additional sealing layer which is welded onto the surface of the substrate in a hot lamination process.

Furthermore, the film may be laminated on directly, i.e. a material bond is formed between the film and substrate without melting on a sealing layer by the action of pressure and heat.

Preferably the film is flat. However, it is also possible for the film to be moulded, locally in order to form deformable chambers, for example, or to be indented so as to form pressure- or vacuum-controlled valves and microactors.

On this subject reference is made to the specifications bearing the application numbers PCT/EP2009003908 and PCT/EP2009003907, the content of which is incorporated in its entirety in the present disclosure by reference.

In addition to a first film, a second film may be arranged on the plate-shaped substrate and/or the first film. The second film may comprise further microfluidic structures such as channels, chambers and/or openings. Preferably the second film comprises structures for a biosensor, particularly measuring means such as electrical contacts and electrical potential surfaces or optical structures such as optical waveguides or optical reflective surfaces.

In microfluidic tests, the analyte that is to be measured (such as for example blood, saliva, urine) may be supplied to the microfluidic biosensor generally through one or more inlet channels which branch off from a filling region.

The filling region is supplied with the analyte through a fill opening, the fill opening being a bore in a plate-shaped substrate.

By the term bore is meant, within the scope of the present disclosure, an opening or indentation in one of the plate-shaped substrates. The shape of the opening may be cylindrically round as is conventional in bores or it may also be oval in cross section or square, angular or triangular in cross section. Three-dimensional shapes for the bore such as a tear drop structure are also possible.

Advantageously, at least one of the plate-shaped substrates has a sealing lip in the region of the fill opening. This sealing lip performs the function of fluidically sealing the fill region, i.e. the fill opening.

Therefore, it is particularly advantageous that the sealing lip should continuously surround the fill opening.

A sealing lip is provided particularly when no adhesive bond is formed between at least one side of the film and a substrate.

Preferably the sealing lip in this case is embodied as a cutter projecting from a substrate surface. When the components are joined together the cutter is then pressed into the film and seals off any gaps between the film and the substrate. The cutter is preferably wedge-shaped but may also be in the shape of a segment of a circle, a rectangle or a triangle.

Alternatively, the sealing lip may also be a seal, particularly a ring seal of elastic material such as silicon which is compressed during the joining process and thereby creates a sealing connection with the film and the substrate. The sealing ring may be placed in a depression in the substrate surrounding the fill opening.

As an alternative to a sealing ring it is also possible to use an elastic sealing material as the encircling sealing lip, this sealing lip being formed by a bead of elastic sealing compound which is applied before the joining operation to the region of the fill opening.

Adhesives or adhesive films may also be used as sealing materials.

A correspondingly arranged bore may also be provided in the film and/or films. Preferably the fill opening is arranged in a second plate-shaped substrate, particularly a cover element.

This cover element is particularly preferably provided with a filter element, particularly a membrane, for filtering particles out of the sample liquid.

With blood-based diagnostic tests in particular it is generally necessary to filter the blood in order to be able to carry out measurements on blood plasma with as little interference as possible.

The membrane is advantageously glued or welded into a recess or depression in the substrate and then forms a component with the cover element. As the membrane should be exposed to the least possible mechanical stresses, so as to avoid tearing the membrane portion, although on the other hand it is essential that the cover element should be firmly and securely attached to the cartridge, a method according to the invention is used for joining the cover element or a plate-shaped substrate in general, in contrast to the conventional ultrasound welding.

For this purpose the cover element and/or the fluid carrying substrate comprises pins which are connected in one piece to this component.

By the term pin within the meaning of the present disclosure are meant all holding means which have a significantly smaller extent in at least one dimension, i.e. in the widthways or lengthways direction of the cover element and/or the plate-shaped substrate, than the cover element and/or the substrate. In particular the term refers to holding means which are cylindrical and have cylinder diameters of a few millimeters.

However, the shape of the pins may also be triangular, square, rectangular or polygonal. In particular, the pins may also be embodied as ribs, i.e. they may have a shape which extends several millimeters in a widthways direction and a few millimeters in a lengthways direction. Ribs of this kind are advantageously arranged in a circle around the fill opening.

These pins, which project from the fluid plate and/or the cover element, are moulded on, particularly during the production of the respective component by injection moulding, which enables them to be manufactured at low cost.

The arrangement of the pins and associated bores in the respective component is selected so that they engage in one another during positioning.

The shape of the bore is advantageously similar to the shape of the pin so that the pins fit precisely in the bore in which they engage.

In order to assist with the positioning and handling during the manufacture of the cartridge, the pins preferably have a slightly chamfered, particularly conical shape, allowing easier positioning of the components relative to one another during handling. Thanks to the broader base of the pins, which corresponds roughly in diameter to the diameter of the bore, self-positioning is achieved when the components are stacked.

As the components of the microfluidic cartridge often have a length and width dimension of only a few millimeters to a few centimeters, corresponding pin diameters or pin widths are selected, the average diameters or widths being selected from 0.2 mm to 5 mm, particularly 0.5 mm to 2 mm.

Advantageously, a single joint should ensure a retaining force of 1 kg or 10 Newtons after manufacture. This means that a cover element withstands at least one perpendicularly acting tearing force of 10 Newtons on each joint.

If a plurality of similar joints are provided, the holding force against tearing is increased.

For the join connection, the components are positioned on a support and a suitable pressing tool, particularly a thermode, in the heated state is pressed on to the ends of the pins with a pressure of 0.5 bar to 5 bar. Alternatively, cold forming may be carried out using a suitable pressing tool if a suitable pressure is applied and the plastics material has the requisite flowability.

The 0.5 bar to 5 bar mentioned are the pressure that acts on the mechanism of the pressing tool. The pressure may be generated pneumatically, hydraulically or servo-electrically.

The thermode preferably has a conical end at the application point, which acts centrally on the end of the pin.

Alternatively the end of the thermode may also be flat or may have a negative dish shape, particularly a negative mushroom shape. Additionally, the negative shape may have a spike in the centre which presses into the end of the pin during moulding and forces the material of the pin outwards.

The thermode exerts a force of 25 Newtons to 250 Newtons on an joint during the forming process.

A weld time of more than 0.5 seconds, particularly 1.5 seconds to 5 seconds, guarantees a sufficient flow of heat from the tip of the thermode into the pin material, the material being heated above its glass transition temperature or softening temperature.

The tool and process temperatures selected for the plastics PS, PMMA, PC, PE PP and PEEK are as follows: PS (100° C. to 180° C., particularly 130° C. to 150° C.), PMMA (100° C. to 180° C., particularly 130° C. to 150° C.), PC (140° C. to 230° C., particularly 160° C. to 190° C.), PE (80° C. to 170° C., particularly 100° C. to 140° C.), PP (90° C. to 200° C., particularly 120° C. to 170° C.), COP and COC (150° C. to 240° C., particularly 170° C. to 210° C.) and PEEK (160° C. to 250° C., particularly 180° C. to 210° C.).

During softening, the plastic material is made to flow by the pressing tool, starting from the centre, so that a head is formed and material is forced under pressure against the wall of the bore. This pressing of material causes frictional engagement between the deformed pin and the bore, so that the components are joined together both by frictional engagement and by the interlocking engagement of the head formed.

After the weld time $t_S$ the thermode is lifted away from the joint or the thermode is left on the joint for another period of time, the holding time $t_H$. The holding time $t_H$ is selected such that the join connection solidifies during this time. For example, the supply of heat to the thermode is interrupted for the holding time and/or the thermode is passively and/or actively cooled. The cooling may be carried out for example by an attached cooling system, by blowing air onto the joint (air cooling) or by passive cooling (coolant body).

Alternatively, the components may also be fixed relative to one another during the holding time $t_H$ by a clamping mechanism or holding mechanism. In this case the thermode is lifted away from the joint completely, and advantageously corresponding cooling steps support the solidification of the joint.

Preferably the holding time $t_H$ is 0.2 to 5 seconds, particularly 0.5 to 2.5 seconds.

The short weld ($t_S$) and holding times ($t_H$) that can be achieved guarantee economical cycle times for the joining process.

Advantageously, the tensile strength of the join connection thus produced is at least 25% of the tensile strength of the substrate material.

Particularly preferably, the bores in the plate-shaped substrates, particularly in the cover element on the top on which a head is formed, are provided with a blind hole in which the head is formed, so that a predominantly planar flat surface is maintained on the plate-shaped substrate.

The invention is implemented according to the following embodiments. In the drawings.

Figure 1:
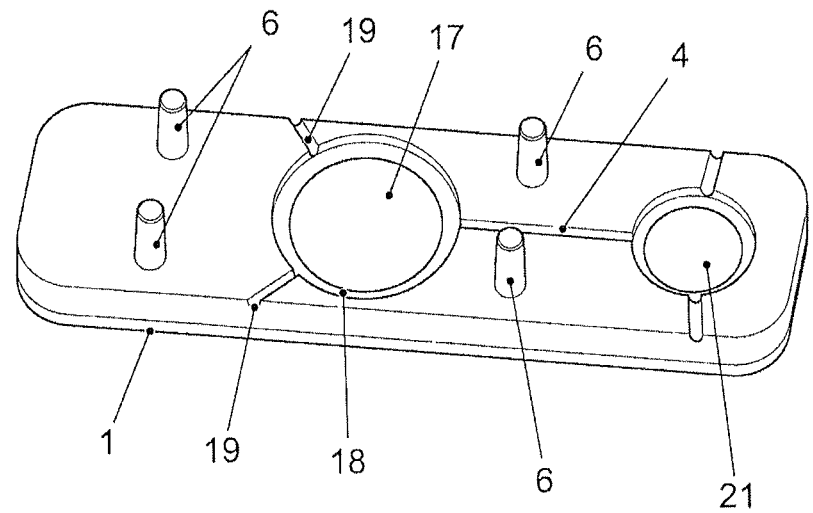
FIG. 1 shows a plate-shaped substrate with microfluidic channel structures
Figure 2A:
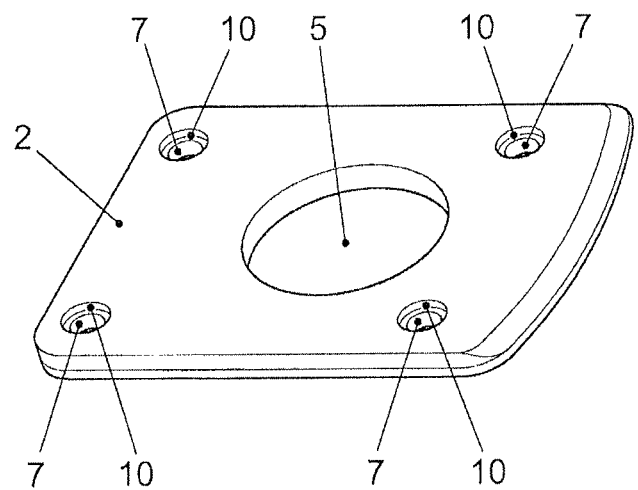
FIG. 2a shows a cover element from above
Figure 2B:
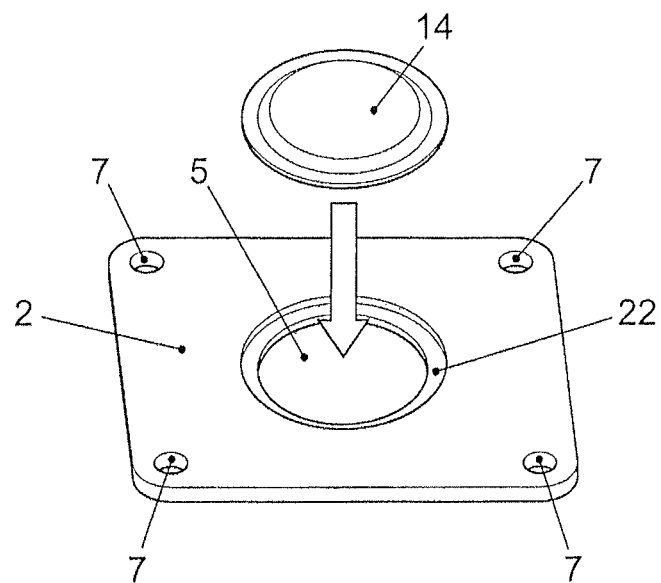
FIG. 2b shows the cover element from below
Figure 2C:
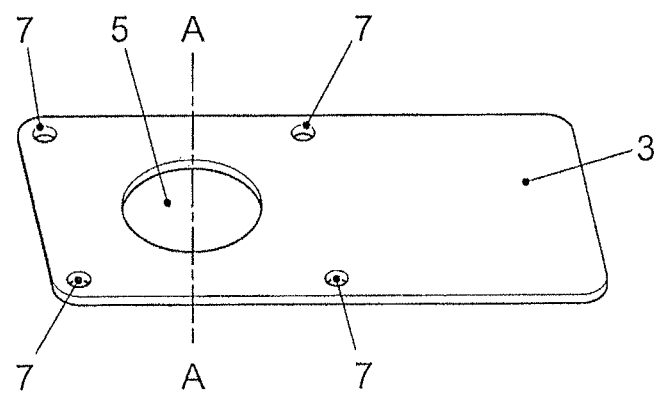
FIG. 2c shows a cover film with inlet opening
Figure 2C:
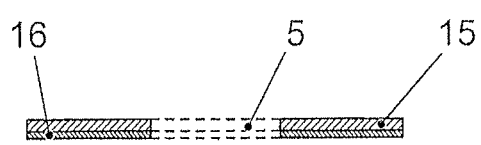
Figure 3:
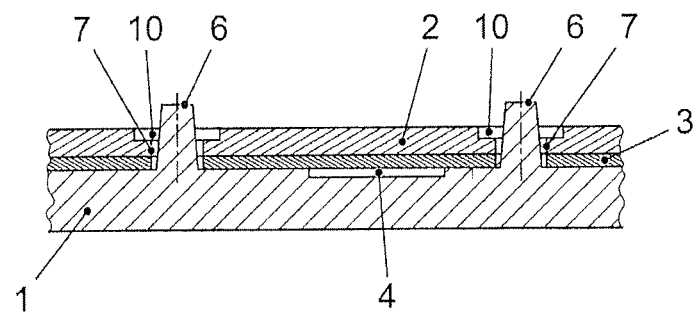
Figure 4:
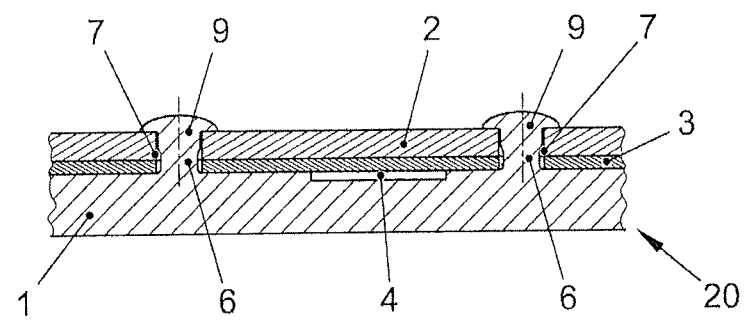
Figure 5:
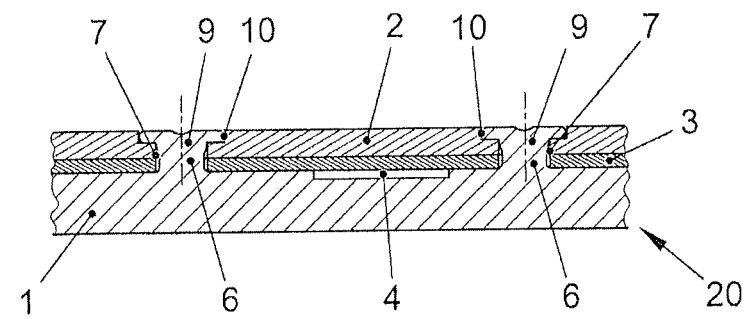
Figure 6:
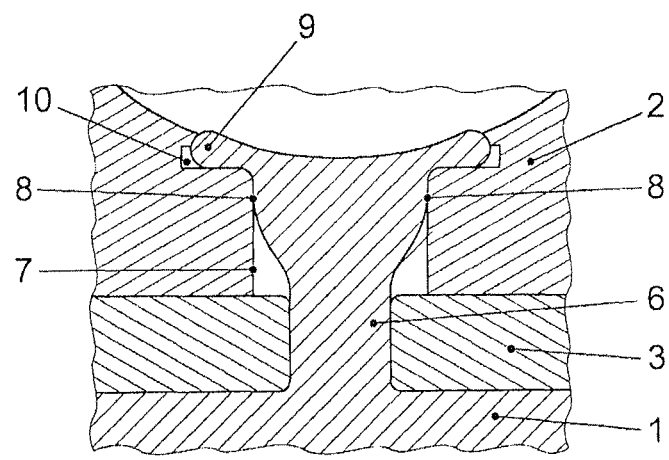
Figure 7:
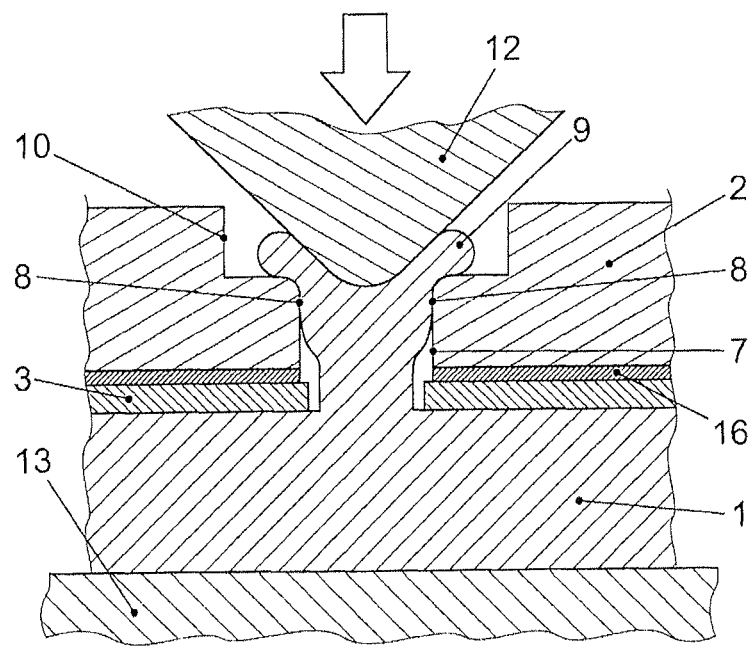
Figure 8:
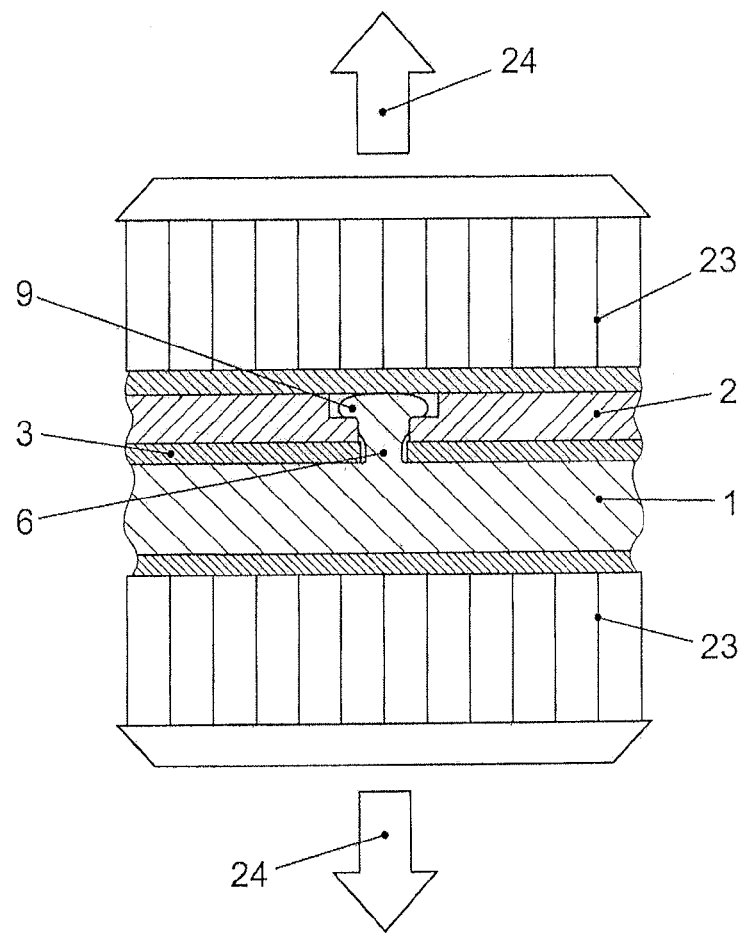
Figure 9:
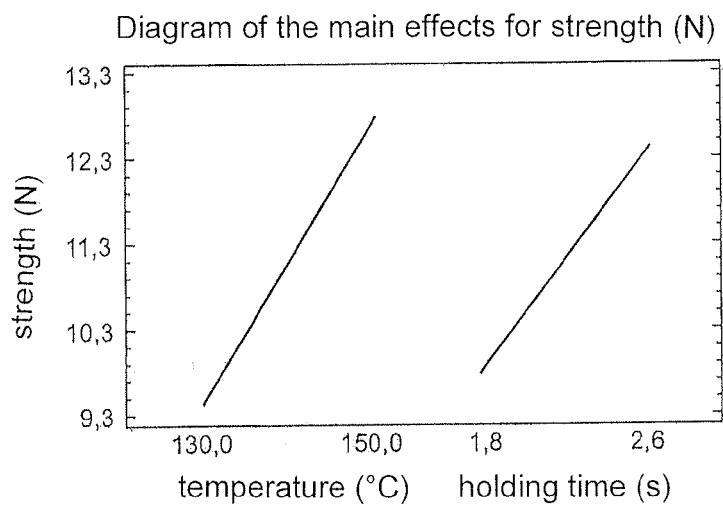
Figure 10:
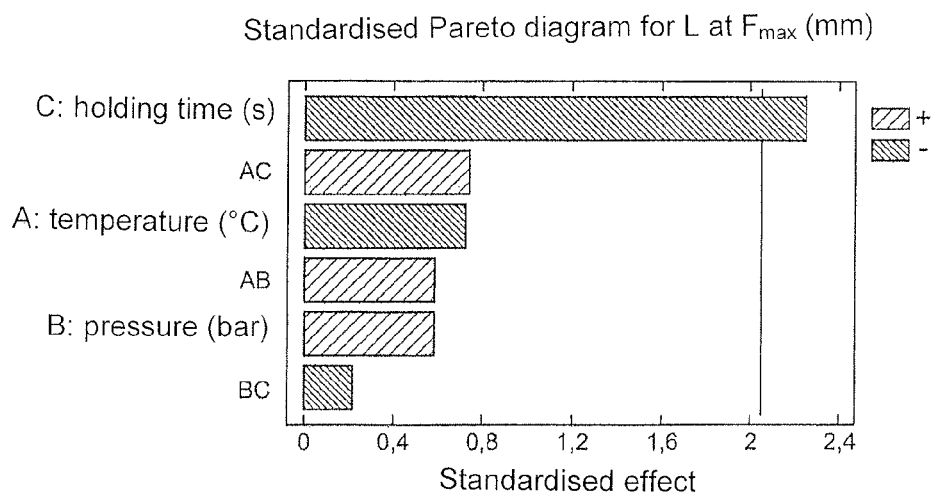
Figure 11:
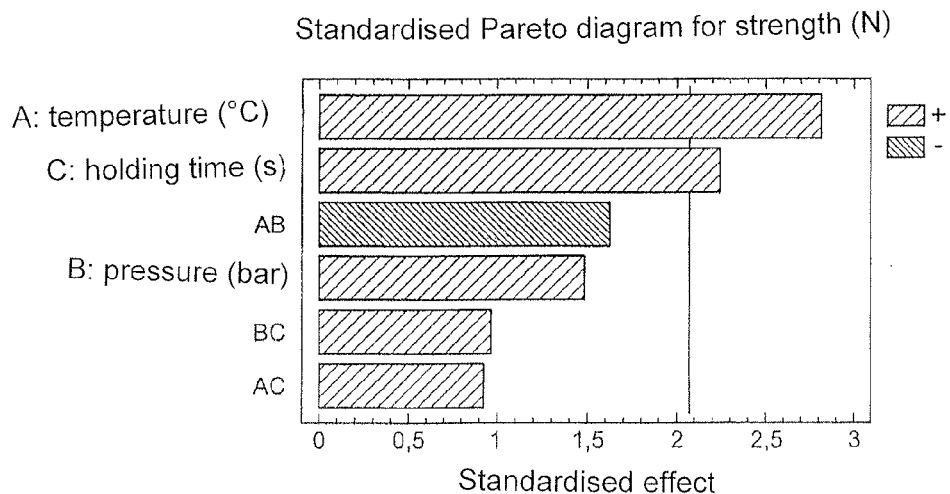
Figure 12:
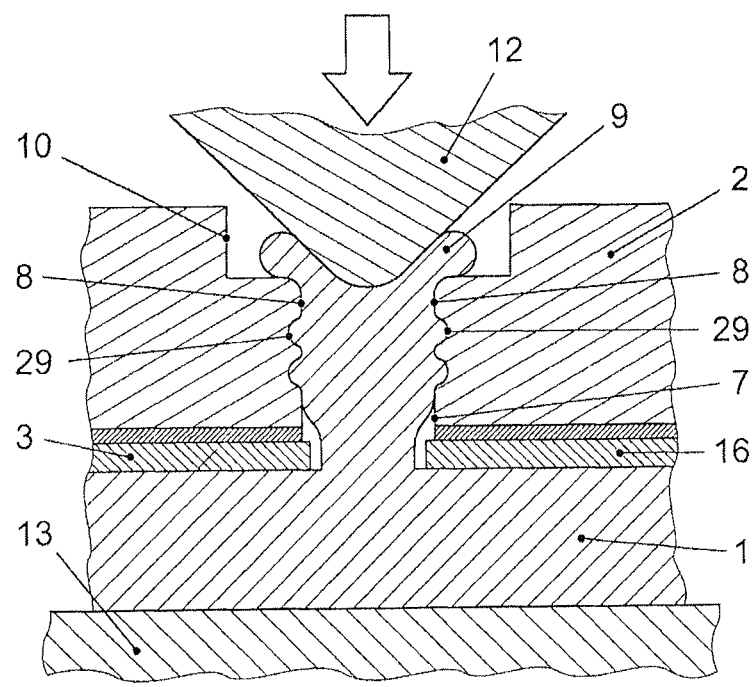

FIG. 3 shows a detail of a cartridge in the manufacturing process after positioning and before the joining step FIGS. 4 and 5 show joined cartridges FIG. 6 shows a polished section of an joint FIG. 7 shows joining using a thermode FIG. 8 shows a schematic loading test FIG. 9 shows diagrams of the strength of the join connection FIGS. 10 and 11 show statistical diagrams for parameters of the join connection FIG. 12 shows an joint with an inner constructional interlocking engagement FIGS. 1, 2a, 2b and 2c are schematic representations of the components of a cartridge (20) according to the invention. This consists of a first plate-shaped substrate (1), particularly a plastic plate a few centimeters long and a few centimeters wide and a few millimeters high.

Formed in the plastic plate are microfluidic structures such as a channel (4), an inlet chamber (17) with a venting trench (18) surrounding the inlet chamber (17), venting channels (19) and an analysis chamber (21).

In order to carry out an analysis using the cartridge (20) a liquid is introduced into the inlet chamber (17) and supplied through the channel (4) to an analysis chamber. Arranged in the analysis chamber is a biosensor which measures a biological or chemical component of the liquid, such as for example a hormone concentration in the blood plasma.

The fluidic network shown here is illustrated in highly simplified form, the cartridge (20) may comprise other microfluidic components as well as reagents for treating the sample, for preparing the sample and for detection.

In the manufacture of a cartridge (20) according to the embodiment shown in FIGS. 1 to 2b, a film (3) is adhesively bonded or laminated onto the first plate-shaped substrate (1).

The film (3) comprises for this purpose, on its underside, an adhesive layer or sealing layer (16) which produces the connection between the substrate (1) and film (3). The film (3) can be shaped by laser cutting or stamping out, while bores (7) for pins (6) and a fill opening (5) for filling the inlet chamber (17) are cut out. Alternatively, the film may also be provided on both sides with an adhesive and/or sealing layer in order to provide both a join/adhesive bond with the first substrate (1) and also with the second substrate (2).

Sticking and/or laminating the film (3) onto the microfluidic structures produces a fluidic network which is sealed all round except at the fill opening (5) and at the openings of the venting channels (19).

Advantageously, it may be envisaged that the bores (7) in the film (3) correspond in diameter to the diameter of the pins (6) or have a somewhat smaller diameter, so that the film makes contact with the pins to form a seal. This is particularly advantageous when fluid-carrying structures are provided in the substrate (1) or in the film (3) close to the pins and there is a risk that capillary forces will cause an undesirable outflow of fluid into cavities in the joint.

Advantageously it is also possible for the diameter of the passage, i.e. the diameter of the bore of the fill opening (5) in the film (3), to be smaller than the bore diameter of the fill opening (5) in the second plate-shape substrate (2) and/or to be smaller than the diameter of the base of the inlet chamber (17).

As the film is generally hydrophobic, the edge and the side surfaces of the film form a fluid stop for aqueous liquids. Thus, the reduced diameter of the film opening (5) prevents any flow of liquid from the membrane (14) in the cover element (2) into any gaps between the film and the cover element (2).

The second plate-shaped substrate (2) which is a cover element (2) in the present embodiment according to FIGS. 2a and 2b, has a substantially central opening (5) into which the fluid to be analysed is filled.

Advantageously, the opening of the throughflow bore is constructed so that the opening width is from 5 to 15 mm.

Particularly preferably, the side surfaces of the bore form a funnel that opens towards the surface and which is matched in its geometry and shape to the size and shape of a fingertip.

FIG. 2a shows the cover element (2) from above. In addition to the central opening, four bores (7) are arranged in the corner regions of the cover element (2), which widens out to form a blind bore (10) on the upper side of the cover. The blind bore (10) has the function of accommodating the rivet head (9) that forms during the joining process, so that it does not project above the surface of the cover (2).

FIG. 2b shows a representation of the cover element (2) from below. The drawing clearly shows the opening (5) that expands in its circumference towards the underside of the cover element so as to form a recess around the opening (5) which has an encircling fixing surface (22). A membrane (14) is placed in the recess and is adhesively bonded or welded to the fixing surface (22).

The spacing of the fixing surface from the surface of the cover element, i.e. the depth of the recess in the direction of thickness of the cover, corresponds approximately to the membrane thickness. This ensures that the underside of the membrane (14) and the underside of the cover element (2) form a flat surface and the membrane abuts on the opening (5) in the film (3) according to FIG. 2 after the components have been joined together to form the cartridge (20).

Figure 2D:
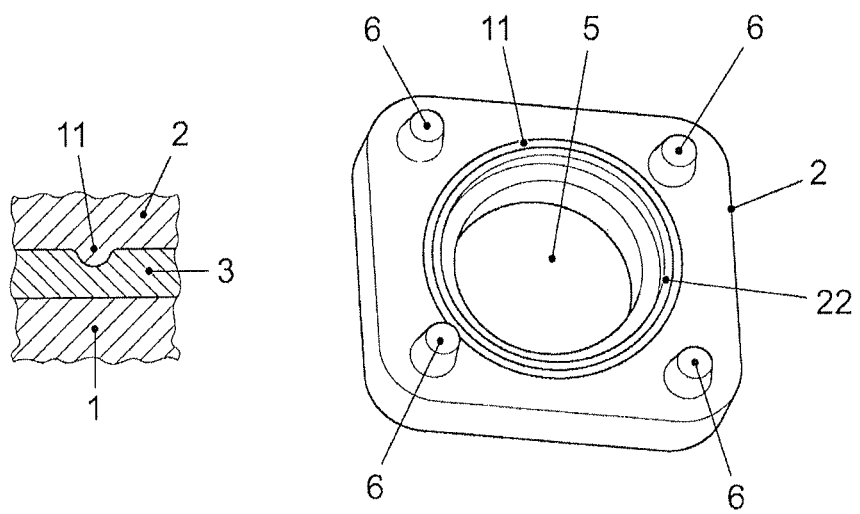
FIG. 2d shows a cover element with pins and encircling sealing lips
Figure 2E:
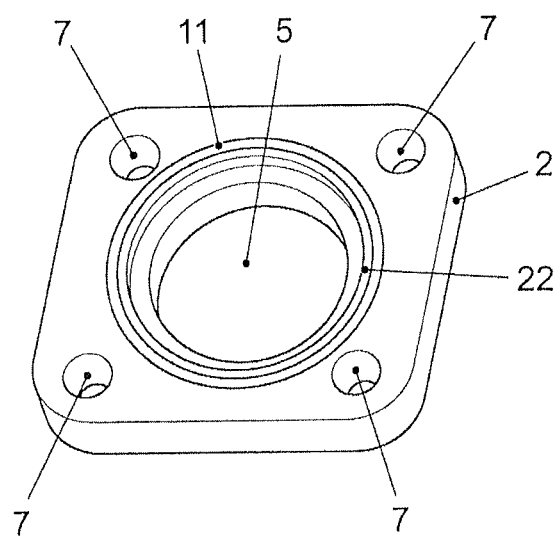
FIG. 2e shows a similar cover element with bores

FIGS. 2d and 2e show cover elements (2) analogous to the cover element (2) shown in FIGS. 2a and 2b. The side shown is that which abuts on the film (3) in the cartridge (20).

Adjoining the regions of the fill opening (5) is first of all the encircling recessed fixing surface (22) in which the membrane (14) is arranged.

Two annularly encircling sealing lips (11) can also be seen.

As can be seen from the left-hand detail of FIG. 2d, the sealing lip projects out of the substrate surface of the cover element (2) and is connected in one piece with the substrate.

The tip of the sealing lip forms a cutter which presses into the film (3) after the joining together of the components, as shown in one of the drawings.

By the cutter, for the purposes of the present application, is meant any wedge-shaped, blade-like, annular or rounded moulding in the substrate which is suitable for at least partially pressing into the film (3) used.

FIGS. 3, 4, 5 and 7 schematically show the positioning and joining of the cartridge components in the region of the joints.

For this purpose, in a first embodiment according to FIGS. 3 and 7, the first plate-shaped substrate (1) which in cross section has a channel structure (4) covered by a film (3) and the cover element (2) are stacked on one another on a support (13).

The plate-shaped substrate (1), particularly the base element (1), has conical pins (6) which project from the surface of the substrate (1) and are integrally connected therewith. The pins may easily be formed by injection during the injection moulding process for producing the substrate plate (1) made of polystyrene.

The conical shape of the pins (6) in which the pin base substantially corresponds in diameter to the diameter of the bore (7) in the lid (2) has the advantage that self-centring of the cover (2) and base plate (1) to one another takes place.

FIG. 7 shows the shaping process of the conical end of the pin (6) after the positioning step.

It is apparent that the film (3) is provided with an adhesive layer (16), at least in the environment of the joint, which produces an adhesive force and a sealing connection between the film (3) and the cover (2).

In order to attach the pin (6) in the bore (7) a pressing tool (12) is applied centrally to the end of the pin with a predetermined pressure P. In the embodiment shown the pin diameter is 1 mm at the base and 0.7 mm at the conical tip, the pin material being polystyrene (PS).

The pressing tool (12) is heated and in the present embodiment it has a tool temperature of 130° C. to 150° C. for shaping PS. For other plastics or tool geometries the tool temperature is adapted accordingly.

The pressing tool, the thermode (12), is rod-shaped, with its head converging in a conical or pyramidal shape.

The thermode is applied to the end of the pin with a tool pressure p of 1.5 bar to 5 bar.

The tool pressure is the pressure that bears on the holding-down mechanism of the tool.

The holding down mechanism will be a pneumatic cylinder with a ram surface of about 2000 mm$^2$.

Thus, when converted, a range from 100 Newtons to 1 kiloNewton is obtained for the application force of the thermode (12), this force being distributed over the thermode tips. When four joints are being thermally shaped simultaneously, a force of 25 Newtons to 250 Newtons is obtained with which the thermode tip acts on the pin (6) and reshapes it.

During a weld time $t_S$ of 1.5 seconds to 5 seconds there is a transfer of heat into the pin end, the pin material being heated above its glass transition temperature and beginning to flow. At the same time it is pressed against the wall of the bore by the ram pressure of the tool so that a frictional connection is formed between the pin (6) and the wall of the bore (7).

As shown in FIG. 7, the conical tip of the thermode displaces the material of the pin from the centre outwards to the circumference, forming a head (9).

Plastic deformation of the cover material may also occur in the region of the bores (7) in the cover, as shown in FIGS. 6 and 7.

Alternatively or in addition to the embodiment according to FIGS. 6 and 7 it is also possible to have a construction according to FIG. 12.

Here, in addition to or as an alternative to the moulding of the head (9), one or more annular depressions in the cover element (2) are filled by the thermally-plastically deformed pin material, so that additional interlockingly engaging connecting elements ensure that the base part (1) and the cover (2) of the cartridge hold together.

In embodiment 2 these formations (29) are annular, but other shapes may also be used such as a helical or wedge shape as well as shapes with an undercut.

It is also possible to use a join connection (29) of this kind in the bore (7) instead of the head on its own.

Alternatively, when higher temperatures or flat thermode ends are used, it is also possible to produce a predominantly interlocking connection. In this case, the pin material flows predominantly only to form the head, while regions located further on in the bore are scarcely deformed.

In order to ensure that the components are fixedly attached to one another, the components are fixedly positioned to one another, particularly by clamping, for a further holding time $t_H$. Advantageously the positioning can be achieved by maintaining the thermode contact pressure and/or by externally clamping the components. In the former case the thermode is pressed onto the joint throughout the holding time and during this time the thermal heating is interrupted and/or active cooling takes place.

Alternatively, a resilient hold-down device (not shown) may be mounted on the thermode, so that the tip of the thermode can be raised a first distance from the joint, while the spring force of the hold-down device continuing to compress the components during the holding time $t_H$.

Alternatively, a separate holding device (not shown) may be provided on the joining device, which positions the components and presses them together during the weld time $t_S$ and the holding time $t_H$.

Preferably, the weld time $t_S$ and the holding time $t_H$ can be adjusted and controlled separately. The holding time $t_H$ is preferably 0.2 to 5 seconds, particularly 0.5 to 2.5 seconds.

The compressing or clamping of the components prevents relaxation of the plastic components until the joint has set.

FIG. 6 shows a polished section of the finished joint in cross section. To mark out and distinguish the components they have been shaded and the edge surfaces have been graphically emphasised.

The polished section shows a cartridge in the region of a point of attachment, the PS base plate (1), a film (3) and a cover element (2) being joined together by means of the plastics riveted join connection thus formed.

The drawings clearly show the wall of a bore (7) into which the pin (6) projects. A corner of a blind hole (10) remains in the top left hand corner.

The thermal pressure-driven joining process causes the pin material to be pressed against the edge of the bore, as is clearly shown, where it forms a frictional connection with the cover element (2).

It is also apparent that the material of the cover (2) is also plastically deformed in the region of the joint, so that the moulded head (9) of the pin makes contact by interlocking engagement with the bottom of the blind hole, and abuts in interlocking engagement in the side region on the plastically deformed cover material and/or is surrounded by the cover material.

If sufficiently high tool temperatures and/or sufficiently high weld times $t_S$ are used, the head (9) of the pin and the cover (2) can be materially connected to one another locally.

Preferably, the cover (2) and base element (1) should be made of the same plastic, for a material connection, or from plastics with similar softening temperatures that can be connected to one another.

The tool temperature and the weld time $t_S$ essentially determine the strength of the join connection, as can be shown by the following load tests.

FIG. 8 schematically shows a load test of this kind.

In order to carry out the load test the base component (1), the film (3) and the cover (2) are joined by a single pin (6)-head (9) joint.

In this test of the joint there is no additional join connection between the film (3) and cover element (2), so that the cover element (2) is held only by means of the rivet joint.

The base element (1) and cover element (2) components joined by the pin connection are connected to holding means (23). In the test, these were clamping brackets which were adhesively bonded to the components (1, 2) with their side face over a large area.

In the tests described below, various rivet joints were tested for their load bearing capacity under mechanical stress.

The objective was to obtain statistical information as to the average load bearing capacity of a rivet joint and regarding parameters influencing the strength and durability of such a joint.

In the test, conical pins (6) were used with a diameter of 1 mm at their base and 0.7 mm at their conical tip and with a height of 1.5 mm. These were provided with a rivet head (9) by thermal forming as described.

After the riveting the pin height is about 0.8 mm including the height of the head (9).

As shown in FIG. 6, at least 50% of the pin material is reshaped during the joining process.

After the joining and attachment of the clamping brackets (23) the assembled cartridge (20) is inserted in a ZWICK tension machine using the clamping brackets (23) and a tensile test is carried out.

In order to obtain statistics, tests were carried out on 42 riveted cartridges, subjecting a single rivet joint to the tensile test in each case and testing different riveting parameters.

For planning the tests, the method of statistical test planning, also "Design of Experiments" (DoE) was used to reduce the number of tests but still ensure a high degree of accuracy and reliability of the results. In this method the parameter field is not investigated completely in discrete steps but rather just a few points are tested experimentally. The missing measuring points can be interpolated using statistical methods. Thus it is possible to reduce the number of tests needed which serve to determine the main influencing variables (hereinafter referred to as parameters or influencing factors) and their optimum setting for the strength of the rivet joint in the hot riveting process, from $x^y$ (x is the number of steps or the number of discrete steps and y is the number of factors). A DoE test plan varies the values for the influencing factors determined simultaneously over several stages (values). When the test is carried out successfully a mathematical model of the process can be produced within the test chamber. In this way significant influences and interactions between the parameters can be detected.

The essential criterion in choosing the parameter settings was the objective of covering a range in which any influence of the process parameters on the strength of the rivet joint can be detected. Additionally, central test points (centre points) were determined. At a centre point of this kind the parameter settings occupy the average value of the test chamber. This makes it possible to check whether all the influencing factors are exerting an approximately linear influence on the results, and moreover the scattering at the test points can be estimated by multiple repetitions of the centre point. In view of the criteria to be met (low number of tests, presumed linearity and three influencing variables) a $2^3$ fully factorial test plan with a 3-fold centre point was carried out.

The three factors of pressure p (in bar), temperature T (in ° C.) and time t (in seconds) were tested.

The tests established that the joining pressure for the rivet joint described, the conical thermode (12) used and the polystyrene plastic pins (6) used has to be at least 1.8 bar in order to achieve a reliable head formation and not more than 2.6 bar in order to prevent damage to the components by the joining process. For the weld time, these marginal conditions produced a minimum weld time $t_S$ of 1.8 seconds and a maximum permissible weld time $t_S$ of 2.6 seconds.

Taking account of these marginal conditions the following sets of parameters were chosen:

| Test No. | Temperature (° C.) | Pressure (bar) | Weld time (s) |
|---|---|---|---|
| 1 | 130 | 1.8 | 1.8 |
| 2 | 140 | 2.2 | 2.2 |
| 3 | 150 | 1.8 | 2.6 |
| 4 | 130 | 2.6 | 2.6 |
| 5 | 150 | 2.6 | 1.8 |
| 6 | 150 | 2.6 | 2.6 |
| 7 | 130 | 1.8 | 2.6 |
| 8 | 130 | 2.6 | 1.8 |
| 9 | 150 | 1.8 | 1.8 |
| 10 | 140 | 2.2 | 2.2 |
| 11 | 140 | 2.2 | 2.2 |

To ensure reliability of the results the 11 partial tests carried out were repeated several times.

The following results were obtained:

| Test No. | L at Fmax in mm | Fmax in N |
|---|---|---|
| 1.1 | 1.62 | 12.07 |
| 1.2 | 0.49 | 4.09 |
| 1.3 | 0.29 | 5.34 |
| Centre point | 0.19 | 9.62 |
| (2, 10, 11) | 0.19 | 8.45 |
| 1 rivet | 0.26 | 11.10 |
|  | 0.19 | 8.80 |
|  | 0.32 | 12.83 |
|  | 0.16 | 10.09 |
|  | 0.29 | 11.53 |
|  | 0.56 | 10.73 |
|  | 0.19 | 10.97 |
| 3.1 | 0.33 | 16.26 |
| 3.2 | 0.29 | 13.31 |
| 3.3 | 0.32 | 12.29 |
| 4.1 | 0.32 | 15.61 |
| 4.2 | 0.29 | 12.62 |
| 4.3 | 0.49 | 9.02 |
| 5.1 | 0.86 | 12.68 |
| 5.2 | 0.96 | 8.27 |
| 5.3 | 0.29 | 9.15 |
| 6.1 | 0.26 | 10.93 |
| 6.2 | 0.29 | 23.67 |
| 6.3 | 0.26 | 12.35 |
| 7.1 | 0.29 | 8.48 |
| 7.2 | 0.19 | 9.28 |
| 7.3 | 0.16 | 7.17 |
| 8.1 | 0.16 | 9.18 |
| 8.2 | 1.59 | 12.88 |
| 8.3 | 0.19 | 9.24 |
| 9.1 | 0.39 | 13.70 |
| 9.2 | 0.16 | 9.14 |
| 9.3 | 0.42 | 13.34 |

In the table the measured variables mentioned are the extension or elongation of the joint L and the force $F_{max}$ acting perpendicularly on the substrates, i.e. on the rivet, at the time of failure of the joint.

Using the statistical evaluation described it is now possible to determine which joining parameters have an effect on the strength of the joint and which elongation L occurs in the event of failure.

The standardised Pareto diagram which is produced from the measured values provides information on this.

The vertical line in the diagrams according to FIGS. 10 and 11 is the 95% significance line of the Pareto diagram. If a factor exceeds this line (e.g. the temperature in the diagram for strength) this factor has a 95% probability of having a significant influence on the target variable under consideration.

FIG. 11 shows that temperature has the greatest influence on the strength of the riveted joint. The higher the temperature, the greater the strength. The effect of the weld time is also guaranteed with 95% probability. Accordingly an increase in the weld time also results in an increase in strength. The pressure and interactions between the influencing variables of pressure P, weld time $t_S$ and temperature T do not have any significant influence in the test chamber under consideration.

It can be seen from FIG. 9 that the strength of the joint increases in the temperature range from 130° C. to 150° C., a strength increase of about 36% being observed.

If the weld time at a given temperature is increased from 1.8 seconds to 2.6 seconds the strength of the joint is increased by about 27%.

FIG. 10 shows that the elongation L of the joint during the failure of the connection, i.e. at the maximum tensile force $F_{max}$, is determined essentially by the weld time $t_S$ which exhibits a significant influence on L.

The tests have shown that T=150° C., P=1.8 bar and t=2.6 s (Test 3) are the optimal manufacturing parameters for the selected geometry of the pin joint and the selected thermal pressing tool and the PS plastic material used. An average force of 13.95 N (1 rivet) could be exerted on the rivet joint before it became detached.

Tests with these parameter values for the temperature and weld time demonstrate that in the embodiment shown a pressure of more than 2.6 bar or, when converted, a joining force of more than 500 N per joint leads to damage to the cover element (2).

In other tests the strength of joint connections with two or more rivets was tested. These showed that the strength, i.e. the holding force of the components to one another, increases with the number of rivet joints but this increase does not correspond to a doubling of the strength if the number of pins is doubled.

LIST OF REFERENCE NUMERALS 1. first plate-shaped substrate
2. second plate-shaped substrate
3. film
4. channel
5. fill opening
6. pin
7. bore
8. frictional connection
9. head
10. blind hole
11. sealing lip
12. thermode 13. support
14. membrane
15. film
16. adhesive layer/sealing layer
17. inlet chamber
18. venting trench
19. venting channel
20. cartridge
21. analysis chamber
22. fixing surface
23. holding means
24. tensile force
29. moulding

The invention claimed is:

1. A microfluidic cartridge for diagnostic analysis equipment, comprising:
   a first plate-shaped substrate (1),
   a second plate-shaped substrate (2),
   a film (3) arranged between the first and second plate-shaped substrates (1, 2),
   channels (4) formed by recesses in at least one of the first and second plate-shaped substrates (1, 2) or the film (3),
   a fill opening (5) disposed through at least one of the first and second plate-shaped substrates (1, 2) for filling the channels with sample liquid,
   at least one sealing lip (11) extending from at least one of the first and second plate-shaped substrates (1, 2) and into the film (3), and extending annularly around the fill opening (5),
   a plurality of pins (6) integrally connected to one of the first and second plate-shaped substrates (1,2) and projecting into associated bores (7) in the film (3) and the other of the first and second plate-shaped substrates (1, 2),
   wherein, at least one of the pins (6) is characterized by thermal deformations, including: (i) a head (9) on the at least one pin that abuts in interlocking engagement on the other of the first and second plate-shaped substrates (1, 2); and (ii) a shaft of the at least one pin (6) at least partially filling at least one of the associated bores (7) so that a circumferential surface of the shaft and a wall of the at least one of the associated bores (7) locally form a frictional engagement (8).

2. The cartridge according to claim 1, wherein at least one of:
   a strength of the frictional and interlocking engagement of a joint of the at least one pin (6) amounts to at least 10% of a tensile strength of a material of the first and second plate-shaped substrates (1, 2); and
   a strength of the frictional and interlocking engagement of a joint of the at least one pin (6) amounts to at least 25% of a tensile strength of the material of the first and second plate-shaped substrates (1, 2).

3. The cartridge according to claim 2, wherein the joint on average withstands a tensile stress load of one of at least 5N.

4. The cartridge according to claim 1, wherein the pins (6) are conical.

5. The cartridge according to claim 1, wherein the bore (7), at the head of the at least one pin, is widened in diameter to form a blind hole (10) into which the head (9) is moulded.

6. The cartridge according to claim 1, wherein the at least one pin has a diameter of 0.2 mm to 5 mm.

7. The cartridge according to claim 1, wherein the film (3) is tightly bonded to one of the first and second plate-shaped substrates (1, 2) via an adhesive layer (16).

8. The cartridge according to claim 7, wherein the adhesive layer (16) is a sticky layer or sealing layer.

9. The cartridge according to claim 8, wherein the adhesive layer (16) is a double-sided adhesive film (16).

10. The cartridge according to claim 1, wherein a material of the first and second plate-shaped substrates (1, 2) is a plastic selected from among: PS, PMMA, PC, COC, COP, PP, PE or PEEK.

11. The cartridge according to claim 1, wherein the plurality of pins project from the surface of the first plate-shaped substrate (1) and engage in bores (7) in the second plate-shaped substrate (2).

12. The cartridge according to claim 1, wherein the plurality of pins project from the second plate-shaped substrate (2) and engage in bores (7) in the first plate-shaped substrate (1).

13. The cartridge according to claim 1, wherein an average diameter of the at least one pin is 0.2 mm to 5 mm.

14. The cartridge according to claim 1, wherein the film (3) abuts on the at least one pin so as to form a seal.

15. The cartridge according to claim 1, wherein the sealing lip (11) is connected in one piece to the at least of the first and second plate-shaped substrates (1,2) and projects from a surface thereof.

16. The cartridge according to claim 1, wherein the sealing lip (11) is an encircling elastic seal.

17. A method of manufacturing the cartridge (20) according to claim 1, characterised in that in a first step the plate-shaped substrates (1,2) and the film (3) arranged between them are stacked on a support (13), in another step a pressing tool is placed on the head end of a pin (6) with a predetermined pressure P and heat is introduced into the pin (6) during a weld time $t_s$, so that the pin material is raised above its glass transition temperature and/or melting temperature and the pin material flows in the bore (7) such that a frictional connection is formed between the pin (6) and the wall of the bore (7) and the substrates (1, 2) and the film (3) remain compressed throughout a holding time $t_H$, during which a joint connection sets.

* * * * *